United States Patent [19]
Mehta et al.

[11] Patent Number: 6,005,417
[45] Date of Patent: Dec. 21, 1999

[54] METHOD AND APPARATUS FOR REDUCING POWER CONSUMPTION IN A DOMINO LOGIC BY REDUCING UNNECESSARY TOGGLES

[75] Inventors: Gaurav G. Mehta, Folsom; Yahya Sotoudeh, San Jose; Chris L. Simone, San Jose; Tsai-Chu Cheng, San Jose; Chi-Kai Sin, San Jose, all of Calif.

[73] Assignee: Intel Corporation, Santa Clara, Calif.

[21] Appl. No.: 08/885,120

[22] Filed: Jun. 30, 1997

[51] Int. Cl.[6] .................................................. H03K 19/096
[52] U.S. Cl. ............................... 326/98; 326/119; 326/121
[58] Field of Search ................................ 326/93, 95, 98, 326/106, 112, 119, 121; 327/407, 408; 364/707; 708/704

[56] References Cited

U.S. PATENT DOCUMENTS

| | | | |
|---|---|---|---|
| 5,208,489 | 5/1993 | Houston . | |
| 5,406,506 | 4/1995 | Jiasheng et al. | 364/784 |
| 5,483,181 | 1/1996 | D'Souza | 326/98 |
| 5,487,025 | 1/1996 | Partovi et al. | 364/784 |
| 5,612,638 | 3/1997 | Lev | 326/98 |
| 5,880,968 | 3/1999 | Dedhia | 708/704 |

OTHER PUBLICATIONS

A 200–MHz CMOS Pipelined Multiplier–Accumulator Using a Quasi–Domino Dynamic Full–Adder Cell Design—Fang Lu and Henry Samueli, IEEE Journal of Solid–State Circuits, vol. 28, No. 2, Feb. 1993, pp. 123–132.

BiCMOS Dynamic Full Adder Circuit for High–Speed Parallel Multipliers H.P. Chen, H.J. Liao and J.B. Kuo, Electronics Letters 4th Jun. 1992 vol. 28 No. 12,pp. 1124–1126.

A BiCMOS Dynamic Carry Lookahead Adder Circuit for VLSI Implementation of High–Speed Arithmetic Unit J.B. Kuo, H.J. Liao and J.P. Chen, IEEE Journal of Solid–State Circuit, vol. 28, No. 3, Mar. 1993, pp. 375–378.

Yuan et al., "New Domino Logic Precharged by clock and Data," Electronics Letters, vol. 29, No. 25, pp. 2188–2189.

Hashemian, "A Fast Carry Propagation Technique for Parallel Adders," IEEE Midwest Symposium—Circuits and Systems, pp. 456–459.

Dhong et al., "High Speed CMOS POS PLA using Predischarged or Array and Charge Sharing and Array," IEEE Trans. on Ckts and Sys., vol. 39, No. 8, pp. 557–564.

Lu et al., "A Bit–Level Pipelined Implementation of a CMOS Multiplier–Accumulator using a New Pipelined Full–Adder Cell Design," 1989 Int'l Conf. on Computers and Communications, pp. 49–52.

*Primary Examiner*—Michael Tokar
*Assistant Examiner*—Don Phu Le
*Attorney, Agent, or Firm*—Blakely, Sokoloff, Taylor & Zafman LLP

[57] ABSTRACT

A method and apparatus for reducing power consumption in a domino logic is provided. An input of the domino logic block has as an output of an upstream logic block. A first state, e.g. default or idle, of the output of the upstream logic block is determined. The an output of the domino logic block corresponding to the said first state is determined. A logic block is modified, such that the output of the domino logic block for the first state is the same as a precharge state of the output. This results in preventing the output of the domino logic block from toggling when the first state is the input to the domino logic block.

20 Claims, 11 Drawing Sheets

METHOD AND APPARATUS FOR REDUCING POWER CONSUMPTION IN A DOMINO LOGIC BY REDUCING UNNECESSARY TOGGLES

FIELD OF THE INVENTION

The present invention relates to digital logic circuits, and more specifically, to logic circuits designed for high-speed synchronous operation, such as domino logic circuits.

BACKGROUND OF THE INVENTION

Performance goals of processors increase in every generation, and progressively more sophisticated architectures are required to implement their complex functions. Advanced architectures require long pipelines operating at very high frequencies. These higher frequencies demand increasing usage of sophisticated circuit design styles like domino.

Domino circuits increase the speed performance of logic circuits by reducing the capacitance associated with the use of P-type metal oxide semiconductors (MOS). Domino circuits accomplish this by precharging a series of logic gates during a first clock phase, or precharge phase, and evaluating the intended logic function during the next clock phase, or evaluation phase. However, domino logic consumes more power than static logic because the domino output precharges every precharge phase and discharges in every evaluation phase when the domino inputs evaluate the output to the discharge state. Thus, unlike static logic, domino logic outputs may toggle even if the inputs do not change.

FIG. 1A represents a prior art domino circuit with nothing to reduce power consumption. A domino logic block 110 is connected to the NMOS evaluation transistor 130, which only allows evaluation while CLK# signal is high. The domino logic block 110 is also connected to the PMOS precharge transistor 120, which pulls the OUT signal 170 high during the precharge phase, while CLK# signal 150 is low. One of the inputs to the domino logic block 110, the IN signal 160, is an output of an upstream logic block. The upstream logic block may be any logic block producing an output. The OUT signal 170 is coupled to a downstream logic block. The downstream logic block may be any logic block having an input.

FIG. 1B represents a timing diagram of the signals used in the circuit illustrated in FIG. 1A. The CLK signal 140 is high during Phase I and low during Phase II. The CLK# signal 150 is the complement of the CLK signal 140. The CLK# signal 150 clocks the domino logic block 110.

The IN signal 160 is an input to the domino logic block 110, and is constant in this example. In this example, the IN signal 160 is illustrated as high, however it may be a low. The OUT signal 170 is the output of the domino logic block 110. The OUT signal 170 is precharged during the precharge phase, while the CLK# signal 150 is low. The OUT signal 170 is evaluated during the evaluation phase, while the CLK# signal 150 is high. In this example, the evaluated output of the domino logic block 110 is low. However, during Phase I, the OUT signal 170 is precharged to a high state. Thus, because of the precharging, the OUT signal 170 toggles every clock cycle. This unnecessarily consumes power.

FIG. 2A represents one prior art method of lowering power consumption using clock gating. A domino logic block 200 has at least one input IN 260. The domino logic block 200 is coupled between an NMOS evaluation transistor 230 and a PMOS precharge transistor 220. Both the NMOS evaluation transistor 230 and the PMOS precharge transistor 220 are driven by the CLK' signal 290. An output LOut 255 of a gating logic block 250 and the CLK signal 140 are connected to the inputs of a NOR gate 240. The CLK' signal 290 is the output of the NOR gate 240. The output of the gating logic block 250 is high when the domino logic 200 does not need to operate.

Thus, when the domino logic block 200 operates, the CLK' signal 290 is the same as the complement of the CLK signal 140. Therefore, the circuit operates identically to the circuit in FIG. 1A. However, when the domino logic block 200 is not needed, the LOut signal 255 is high, thus forcing the CLK' signal 290 to zero. This maintains the domino logic block 200 in the precharged state.

FIG. 2B represents a timing diagram of the signals used in the circuit illustrated in FIG. 2A. The CLK signal 140 is the same as in FIG. 1B. The IN signal 260 is the input to the domino logic block 200. The IN signal 260 is constant, and illustrated as high, in this example. It may be either high or low. The OUT signal 270 is the output of the domino logic block 200. The LOut signal 255 is the output of the gating logic block 250. The LOut signal 255 is a zero when the domino logic block 200 is operating, and a one when the domino logic block 200 is idle. The CLK' signal 290 is the functional NOR of the CLK signal 140 and the LOut signal 255. Therefore, when the LOut signal 255 is low, the CLK' signal 290 is the same as the CLK# signal 150. However, when the LOut signal 255 is high, the CLK' signal 290 is held low or in the precharge state.

In this example, it is assumed that the correct output of the domino logic block 200 is low. Therefore, during normal operation, the domino logic block 200 is precharged during Phase I, and discharged to zero during Phase II. However, when the LOut signal 255 is high, the domino logic block 200 remains in a precharge state and is not discharged. Therefore, the OUT signal 270 remains high as long as the LOut signal 255 is also high. In this way, unnecessary toggling can be avoided while the downstream logic block 210 is busy and the domino logic block 200 is idle.

However, clock gating is difficult to implement. Clock gating may result in clock skew, because of the additional logic in the clocking path, and thereby shift the clock cycle slightly. This causes other logic driven by the clock signal to be shifted with respect to the domino logic block 200. This may cause problems in some timing critical circuits. Further, the turning off and turning on of the gating logic block 250 has to be synchronized with the precharge and discharge cycles. This requires an enable signal which is valid during certain phases of the clock, which requires complex gating logic. Also, in many cases determining when the downstream logic is idle is complicated or impossible, making this method of power conservation unavailable.

Therefore, what is needed is an improved method of lowering power consumption of a domino logic block.

BRIEF SUMMARY OF THE INVENTION

The present invention is an improved method of reducing the power consumption of domino logic. One of the inputs of the domino logic block is an output of an upstream logic block. A first state, e.g. default or idle, of the output of the upstream logic block is determined. The output of the domino logic block corresponding to the said first state is determined. A logic block is modified such that during that first state the output of the domino logic block remains constant at the precharge value of the output. This prevents the output of the domino logic block from toggling when the first state is the input to the domino logic block.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

A method and apparatus for reducing power consumption in a domino logic is described. In the following description, for the purposes of explanation, numerous specific details are set forth in order to provide a thorough understanding of the present invention. It will be apparent, however to one skilled in the art, that the present invention may be practiced without these specific details. In other instances, well-known structures and devices are shown in block diagram form in order to avoid unnecessarily obscuring the present invention.

Figure 1A:
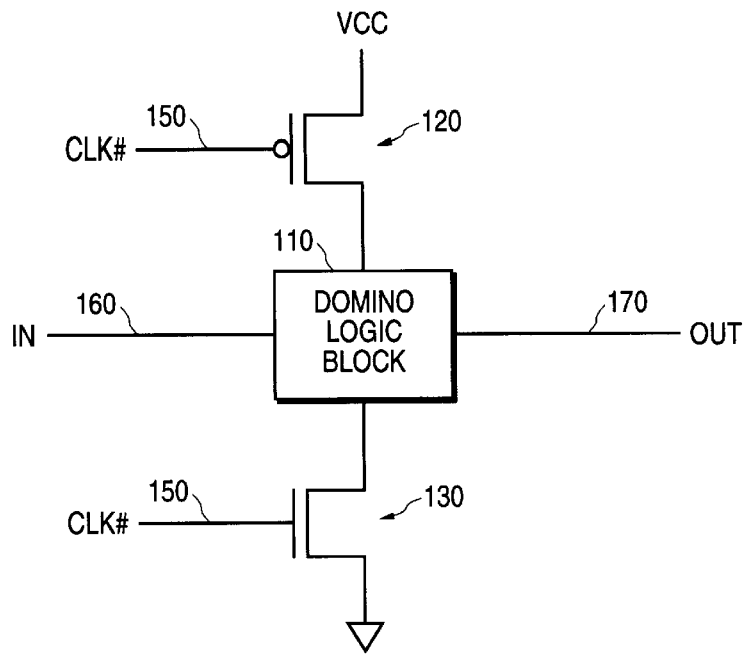
FIG. 1A is block diagram illustrating a prior art domino logic with no power saving technique.
Figure 1B:
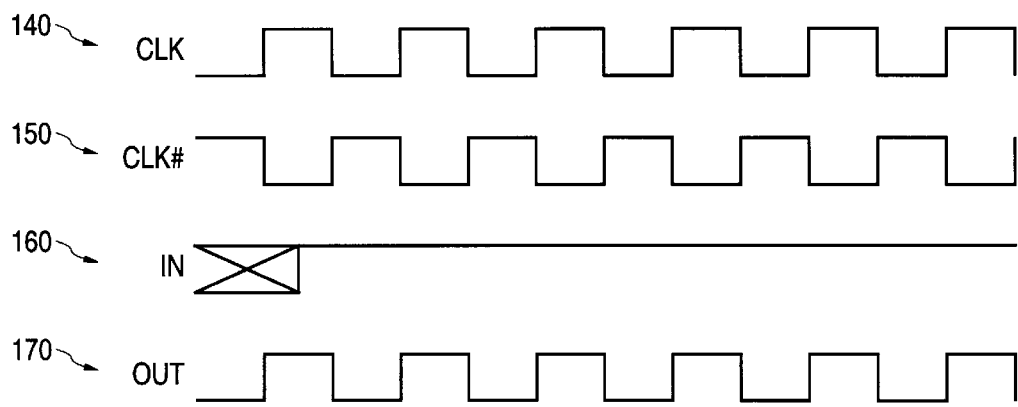
FIG. 1B is a timing diagram illustrating the signals used in the circuit illustrated in FIG. 1A.
Figure 2A:
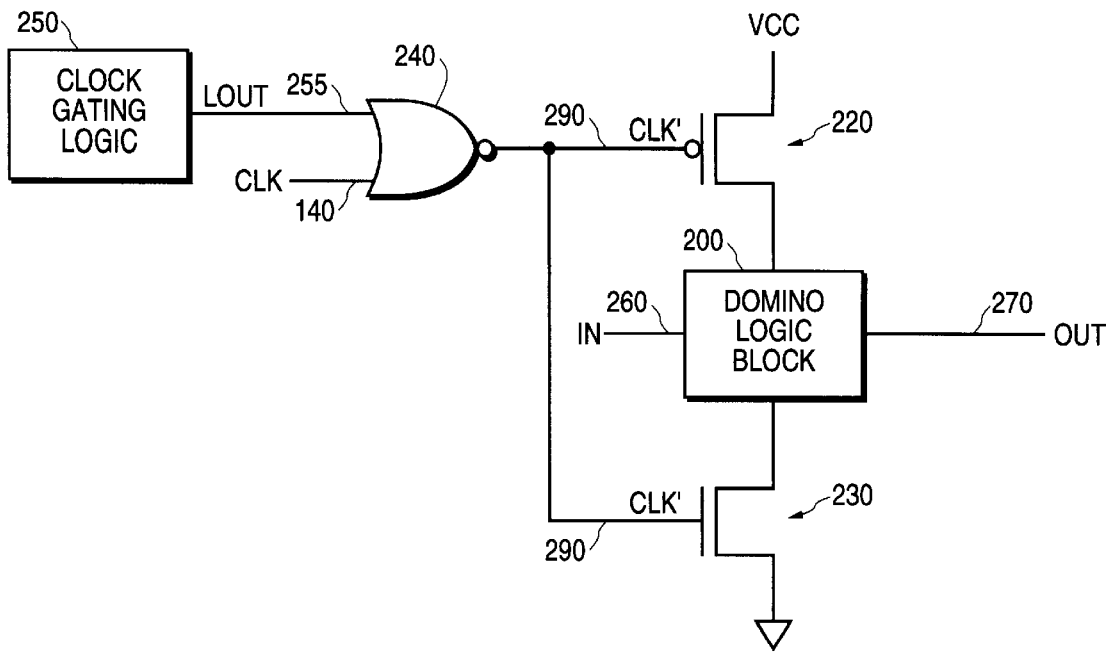
FIG. 2A is a block diagram illustrating another one prior art method of lowering power consumption using clock gating.
Figure 2B:
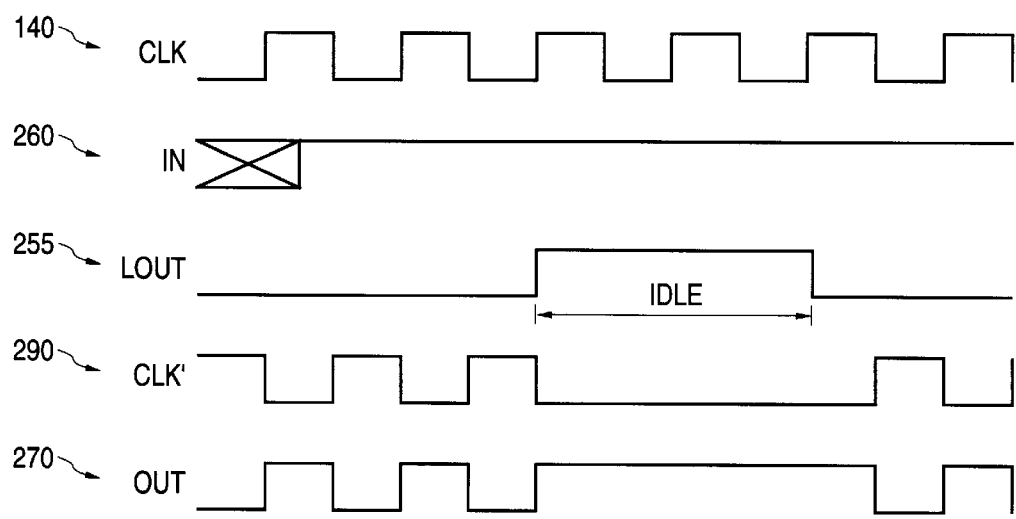
FIG. 2B is a timing diagram illustrating the signals used in the circuit illustrated in FIG. 2A.
Figure 3A:
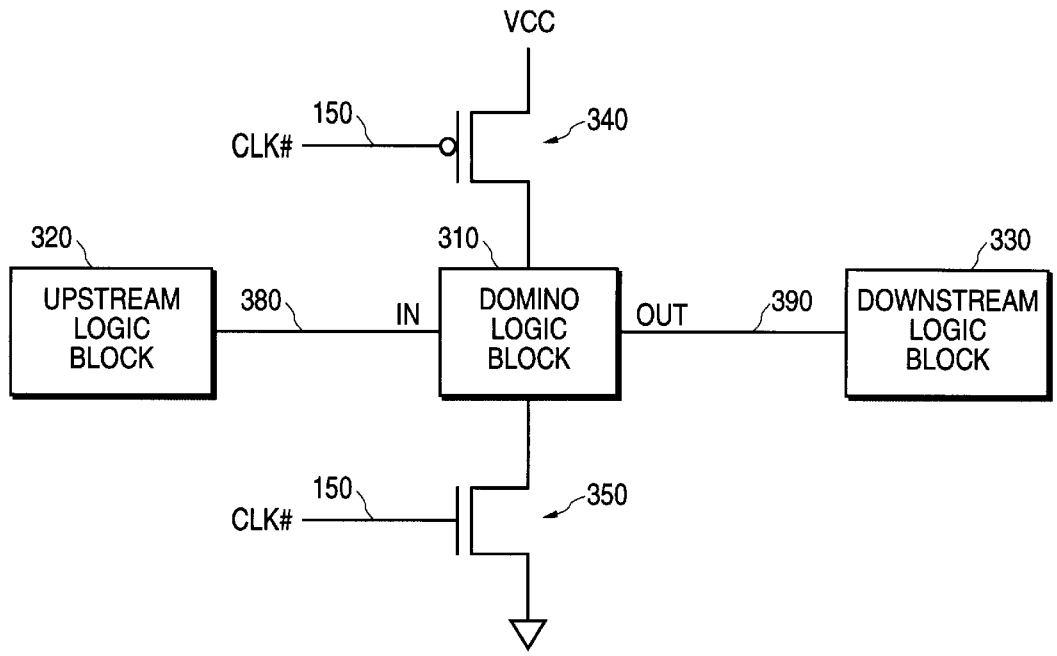
FIG. 3A is block diagram illustrating the domino logic of the present invention.

FIG. 3A is a block diagram of the domino logic of the present invention. A domino logic block 310 is a logic implemented in N-type metal oxide semiconductors. For example, the domino logic block 310 may implement an adder, a multiplexer, or selector. The domino logic block 310 is connected to an N-type metal oxide semiconductor (NMOS) evaluation transistor 350, which only allows evaluation while CLK# signal 150 is high. The domino logic block 310 is also connected to the P-type MOS (PMOS) precharge transistor 340, which pulls the OUT signal 390 high during the precharge phase, while CLK# signal 150 is low. The input signal, IN 380, to the domino logic block 310 is the output of an upstream logic block 320. The upstream logic block 320 may be any logic block which has an output. The domino logic block 310 can have other inputs. The output signal, OUT 390, of the domino logic block 310 is coupled to a downstream logic block 330. The downstream logic block 330 may be any logic block which has an input.

Figure 3B:
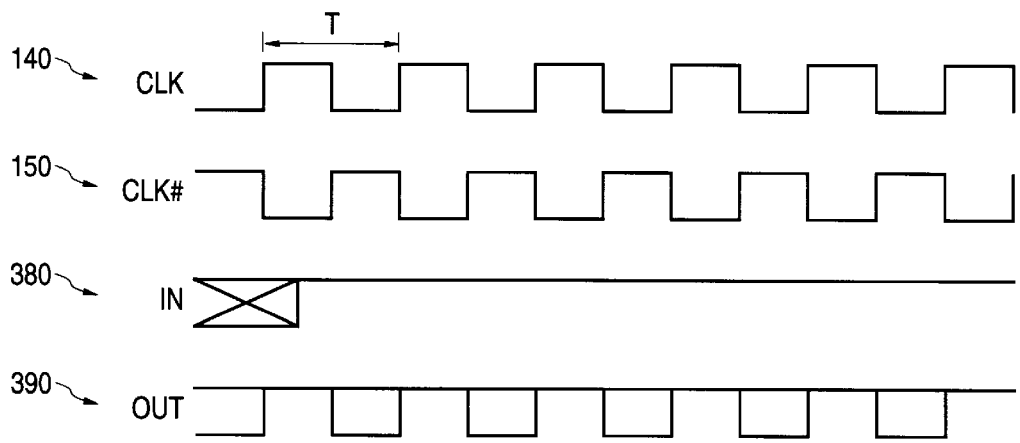
FIG. 3B is timing diagram illustrating the signals used in the circuit illustrated in FIG. 3A.

FIG. 3B is a timing diagram of the signals utilized in the circuit of FIG. 3A. In one embodiment, the CLK signal 140 is a standard clock having a 50% duty signal. In one embodiment, the frequency of the CLK signal 140 is 500 MHz. The CLK signal 140 may be an integrated circuit's reference clock signal, which runs at the integrated circuit's internal operating frequency. In FIG. 3B the period of the CLK signal 140 is denoted T. Phase I is defined as the period during which the CLK signal 140 is high, while Phase II is the period during which the CLK signal 140 is low. The CLK# signal 150 is the complement of the CLK signal 140.

The IN signal 380 to the domino logic block 310 is the output of the upstream logic block 320. In this example, the IN signal 380 may be high or low, but does not change over a number of clock cycles. The IN signal 380 to the domino logic block 310 may not change for a number of reasons. For example, if the downstream logic block 330, which utilizes the OUT signal 390 of the domino logic block 310, is busy, the upstream logic block 320 is stalled, and the IN signal 380 to the domino logic block 310 does not change. In another example, the upstream logic block 320 has an idle or wait state when it is not operating. If the upstream logic block 320 does not have valid inputs or is in a non-functional mode, it may have a default output state. Another example may be if the upstream logic block 320 has a most frequently occurring state. In that case, the output of the upstream logic block 320 may remain in that most frequently occurring state for a period of time. Other situations in which the input to the domino logic does not change may be utilized for the present invention. Any one of these examples may result in the IN signal 380 to the domino logic block 310 not changing for a period of time. However, if logic is not properly modified the OUT signal 390 of the domino logic block 310 may toggle at every cycle. The present invention solves the problem of unnecessary toggling of the OUT signal 390 of the domino logic block 310.

The OUT signal 390 is precharged during Phase I. During Phase II, the function implemented in the domino logic block 310 is evaluated. If the evaluation results in a zero, the OUT signal 390 is discharged and toggles to a zero. If the evaluation results in a one, the OUT signal 390 remains in the precharge state, high. The present invention maximizes the circumstances in which the OUT signal 390 remains high during Phase II, when the IN signal 380 is stable.

Figure 4A:
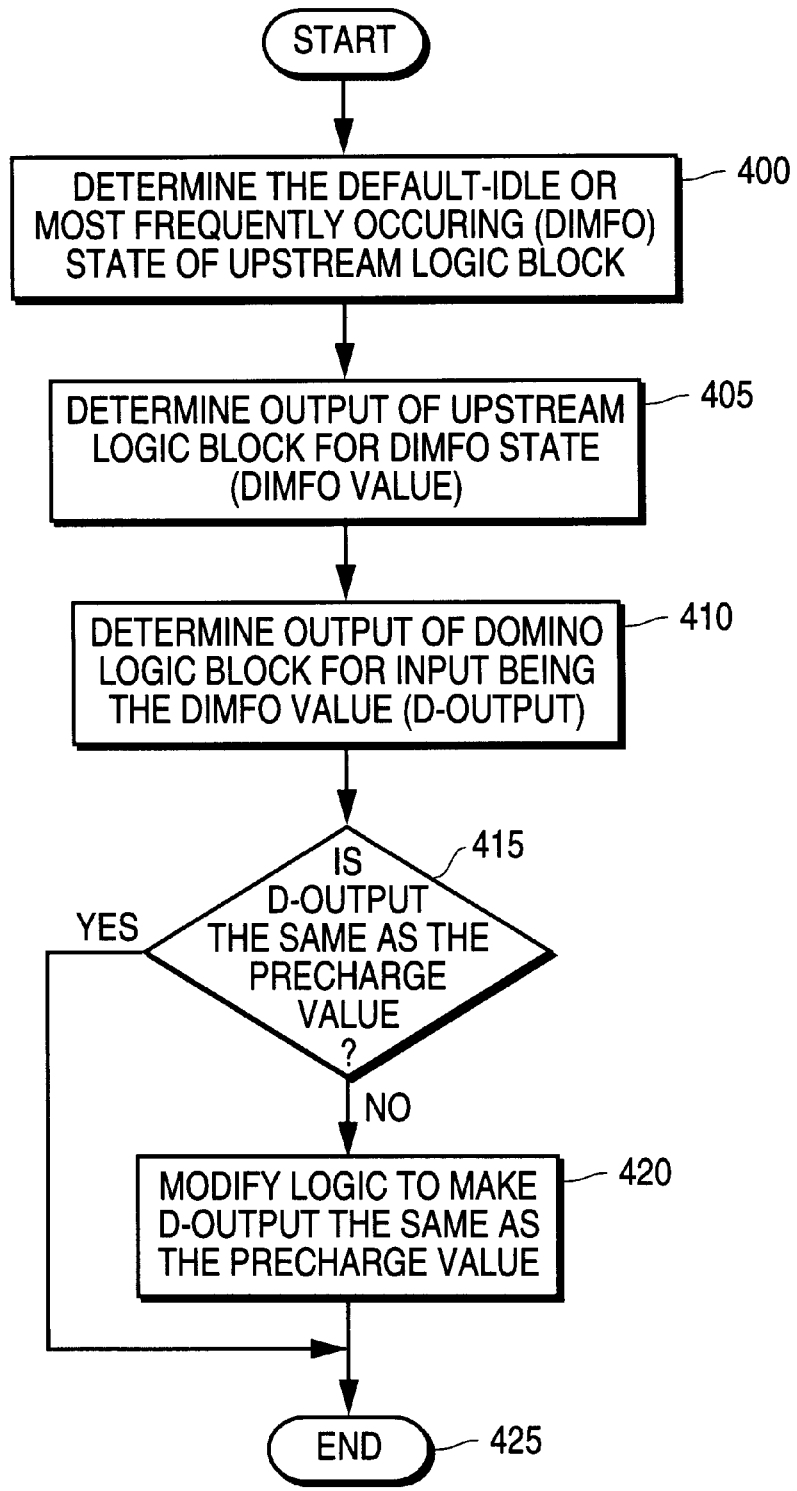
FIG. 4A is a flowchart illustrating the process of the present invention.

FIG. 4A is a flowchart of the process of the present invention. At block 400, the DIMFO state of the upstream logic block 320 is determined. The DIMFO state is a state for which the domino logic block 310 is optimized. In one embodiment, the DIMFO state is the default-idle or Most Frequently Occurring (MFO) state. In some cases, only one of the states default-idle or MFO can be determined for the upstream logic block 320. If there is more than one state, the decision for which state to modify has to be made. Determining for which state to modify depends on numerous factors. This is described in more detail in FIG. 4B.

At block 405, the output of the upstream logic block 320 in the DIMFO state is determined. In one embodiment, the DIMFO value is determined by analyzing the logic of the upstream logic block 320. In another embodiment, the DIMFO value is determined by running a simulation. Such a simulation may, for example, be run on the shareware product such as "Dhrystone". Other methods of determining the DIMFO value are known in the art. This DIMFO value is an input to the domino logic block 310.

At block 410, the output of the domino logic block 310 is determined for the DIMFO output of the upstream logic block 320, which is an input to the domino logic block 310. The output of the domino logic block 310 is designated D-output. In one embodiment, the D-output is determined by analyzing the logic of the domino logic block 310. In another embodiment, the D-output is determined by running a simulation. Other methods of determining the output of the domino logic block 310 for a given input are known in the art.

At block 415, it is determined whether the D-output is equal to the precharge state of the OUT signal 390. The precharge state of the OUT signal 390 is high. Therefore, the determination is whether the domino logic block 310 discharges the D-output or not. If is the same as the precharge value, the domino logic block 310 is already properly configured, and the processing continues to block 425, and ends. If the D-output is not the same as the precharge value, the processing continues to block 420.

If the D-output is not equal to the precharge value of the domino logic block 310, the OUT signal 390 of the domino logic block 310 unnecessarily toggles when the input is a DIMFO input. Therefore, at block 420, logic is modified in order to make the D-output the same as the precharge state. For one embodiment, this is accomplished by adding inverters to the logic blocks such that the toggling is eliminated for the DIMFO input to the domino logic block 310. Determining whether to modify upstream logic block 320 or the domino logic block 310 is made based on a number of factors. This is discussed in more detail with respect to FIG. 4C. By modifying the logic, the unnecessary toggling of the OUT signal 390 is eliminated for a DIMFO input. Finally, at block 425, the process ends.

Figure 4B:
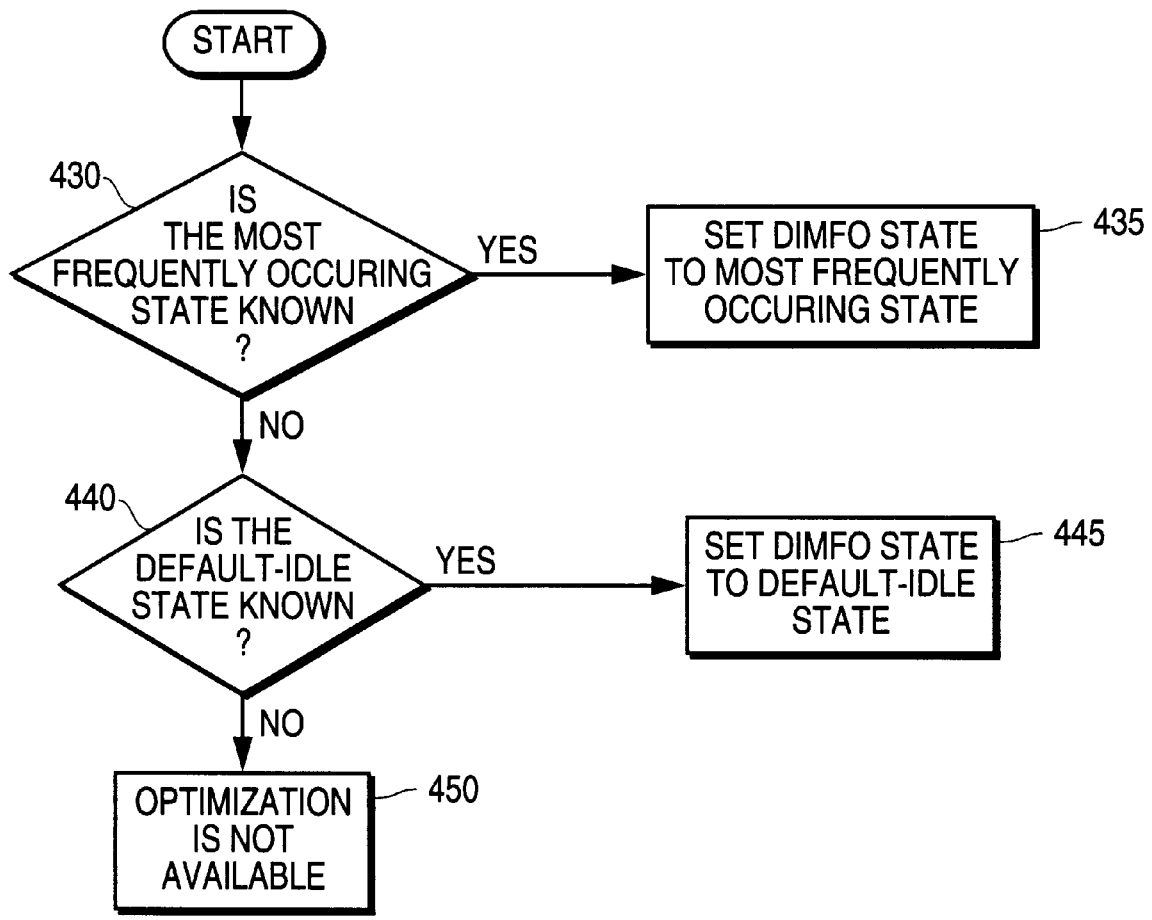
FIG. 4B is a flowchart illustrating the process of determining the DIMFO state in the present invention.

FIG. 4B is a flowchart of the process of determining the DIMFO state. A sample decision tree is illustrated in FIG. 4B. However, it is to be understood that alternative methods of determining the DIMFO state are within the scope of this invention.

As discussed above, the DIMFO state may, in one embodiment, include the default-idle or most frequently occurring (MFO) states of the upstream logic block 320.

At block 430, it is determined whether the most frequently occurring state is known. In some instances, the most frequently occurring state either is not known or does not exist. If the most frequently occurring state is known, the process continues to block 435. At block 435, the DIMFO state is set to the most frequently occurring state.

If the most frequently occurring state is not known, at block 440, it is determined whether the default-idle state is known. The default-idle state, as defined herein is the value a circuit takes on when it has no valid input for purposes of determining an output. Some circuits have a default-idle state. For example, in a multiplexer (MUX), when no select line is asserted, the MUX is in a default-idle state. If the default-idle state is known, the process continues to block 445. At block 445, the DIMFO state is set to the default-idle state.

In some instances no default-idle state exists. In some instances, although a default-idle state exists, it can not be determined. In these cases, the process continues to block 450. At block 450, the determination is made that modification is not available. In this instance, no modification is made to the circuitry.

Figure 4C:
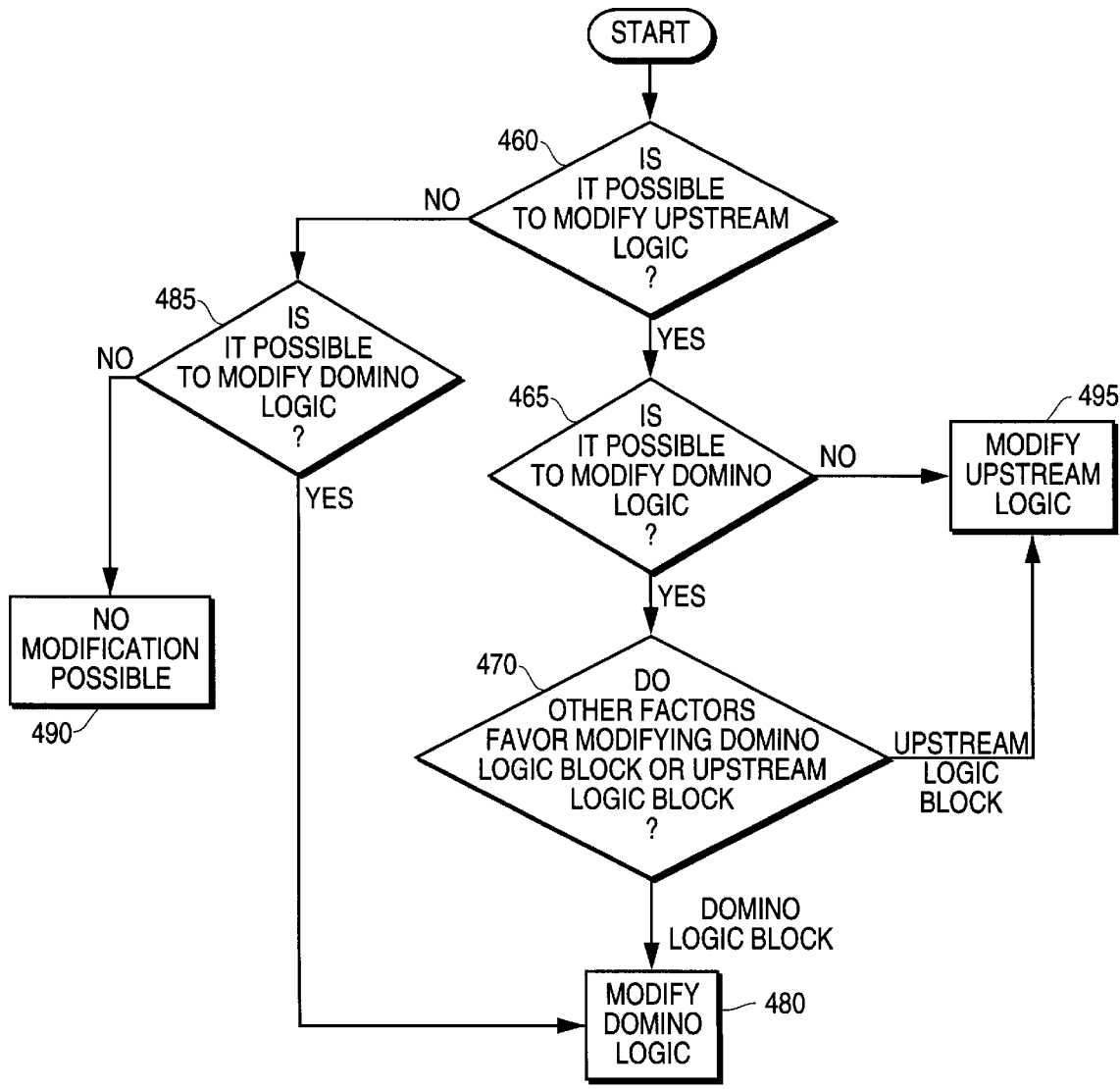
FIG. 4C is a flowchart illustrating the process of determining which logic to modify.

The modification of the logic discussed above with respect to FIG. 4A can be a modification of either the upstream logic block 320 or the domino logic block 310. Deciding which block to modify depends on a number of factors. A sample decision tree is illustrated in FIG. 4C. However, it is to be understood that alternative methods of determining which logic block to modify are within the scope of this invention.

FIG. 4C is a flowchart illustrating one embodiment of the process of determining which logic to modify. At block 460 it is determined whether or not it is possible to modify the upstream logic block 320. Some logic cannot be modified for a number of reasons. For example, the upstream logic block may be too complex to allow modification. The timing of the upstream logic block may be such that modification would cause problems. Other reasons for not being able to modify upstream logic block are known in the art, or may be determined by simulation of the upstream logic block.

If it is not possible to modify the upstream logic block, the processing continues to block 485. At block 485, it is determined whether it is possible to modify the domino logic block. If it is not possible to modify the domino logic block, the processing continues to block 490, and the processing terminates. No modification is possible. If it is possible to modify the domino logic block, the processing continues to block 480, and the domino logic block is modified.

At block 460, if it is possible to modify the upstream logic block 320, the processing continues to block 465. At block 465, it is determined whether it is possible to modify the domino logic block 310. The domino logic block may be unmodifiable for the same reason as the upstream logic block, too much complexity, timing or other reasons. If it is not possible to modify the domino logic block, the processing continues to block 495, and the upstream logic block is modified.

If it is possible to modify domino logic block, the processing continues to block 470. At block 470, it is determined whether other considerations favor modifying the domino logic block or the upstream logic block. Such considerations can include the simplicity of the modification, effect on the speed path, effect on the size of the circuit, etc. In one embodiment, if no other factors are present, modifying the upstream logic block is preferred. At block 484 such preferences are evaluated. If modifying the upstream logic block is preferred, processing continues to block 495, and the upstream logic block is modified. If modifying the domino logic is preferred, the processing continues to block 480, and the domino logic block is modified.

Figure 5A:
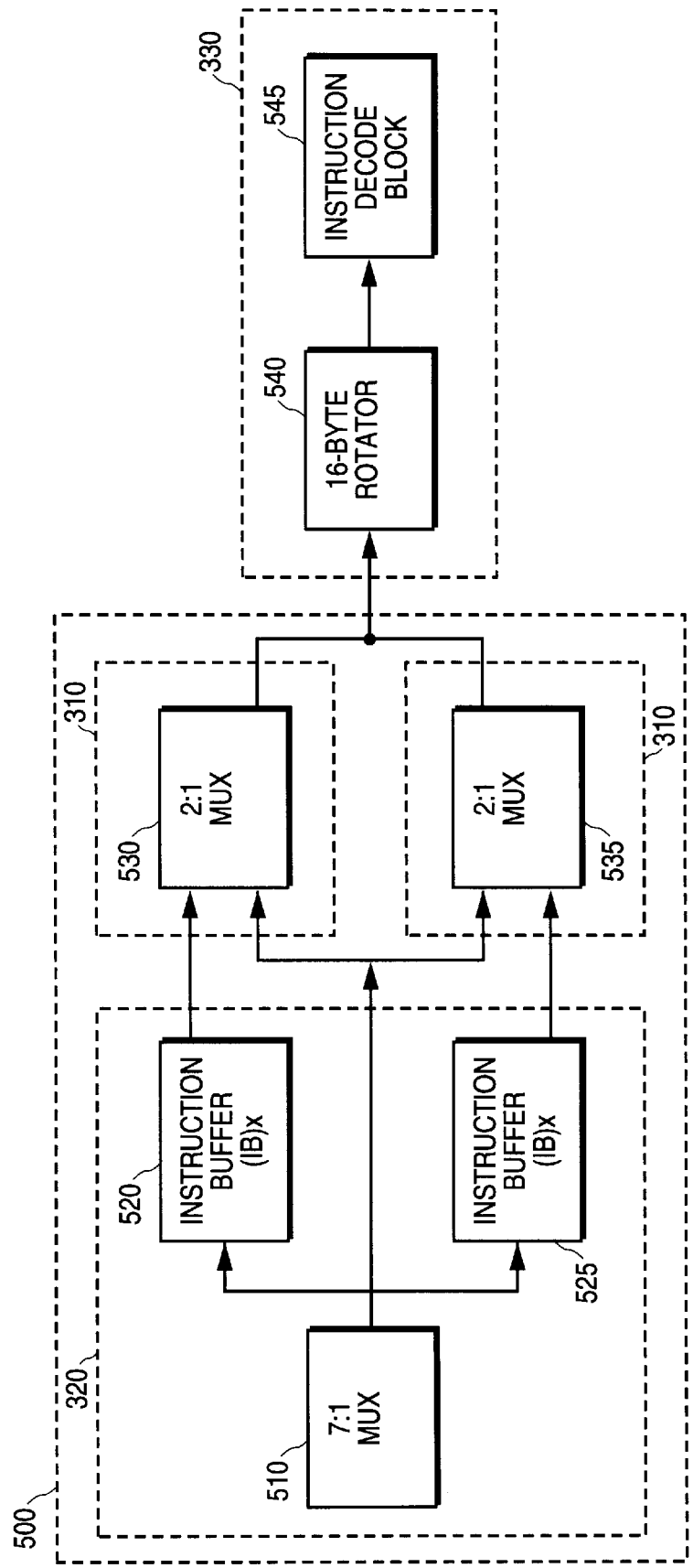
FIG. 5A is a block diagram illustrating a sample circuit including logic, to be modified according to the present invention.
Figure 5B:
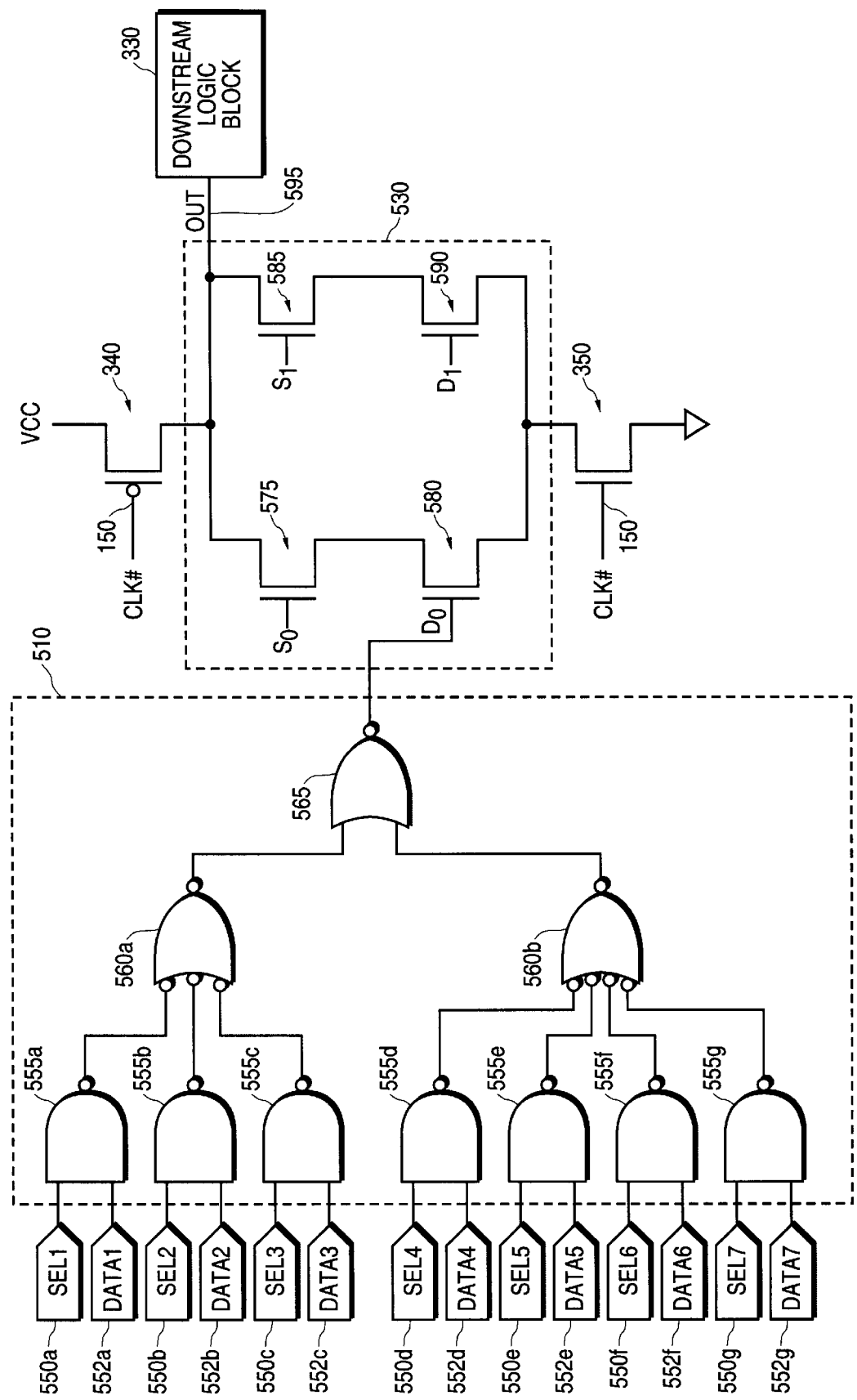
FIG. 5B is a partial block diagram illustrating the circuit of FIG. 5A, showing details of the unmodified upstream logic block and domino logic block.
Figure 6:
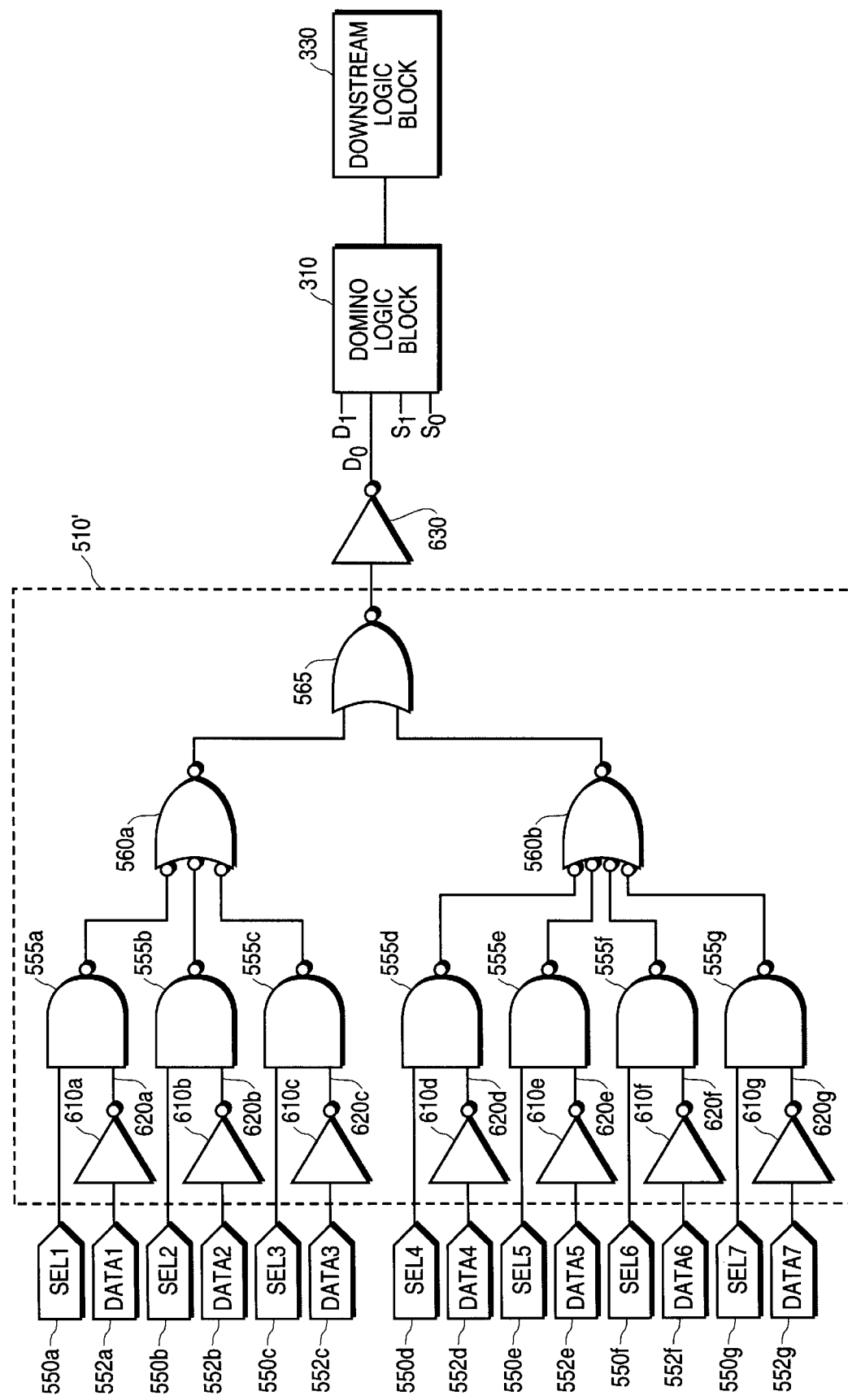
FIG. 6 is a partial block diagram illustrating the circuit of FIG. 5A, showing the details of the modified upstream logic, modified according to the present invention.
Figure 7:
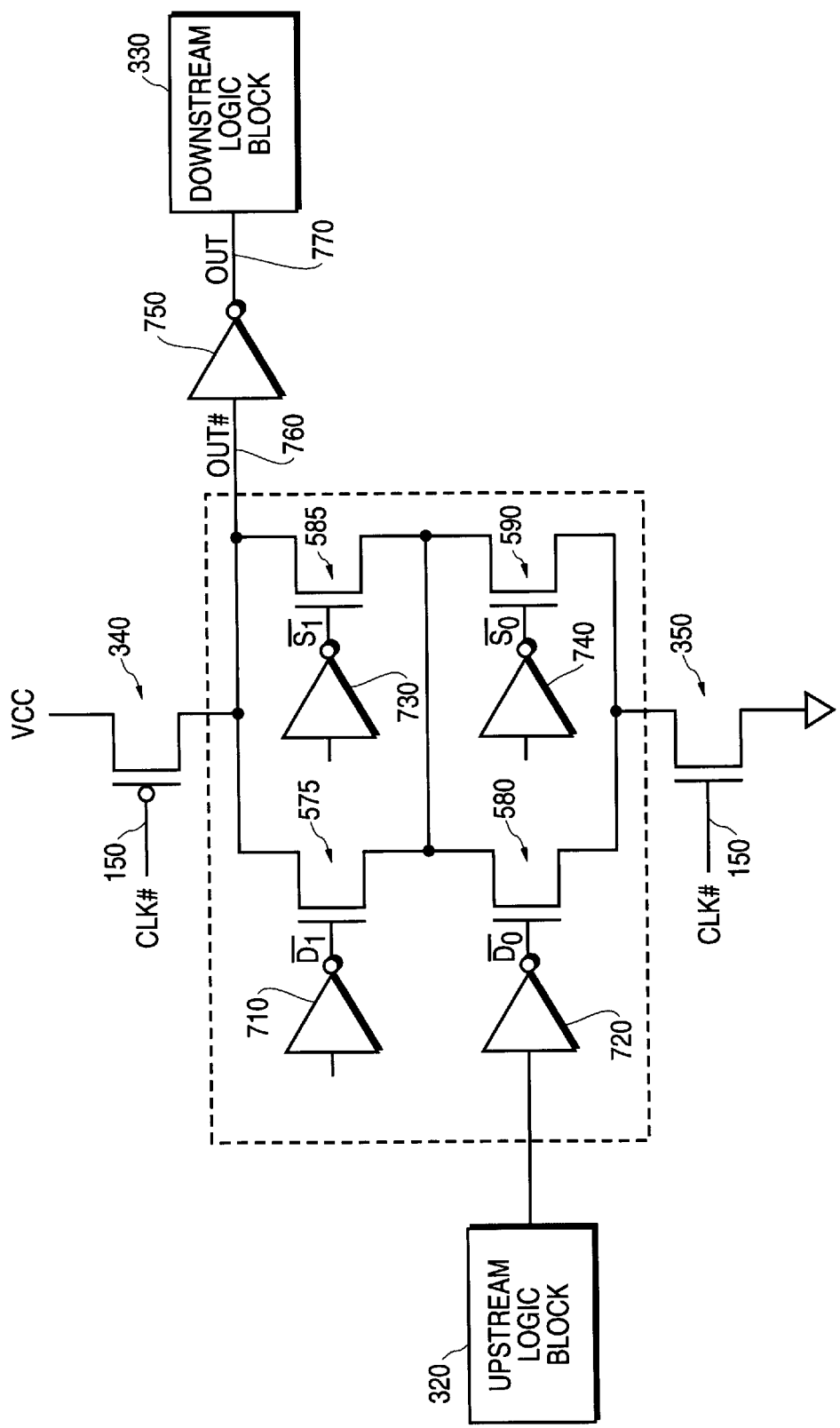
FIG. 7 is a partial block diagram illustrating the circuit of FIG. 5A, showing the details of the modified domino logic, modified according to the present invention.

FIG. 5A illustrates a sample circuit which may be modified according to the present invention. FIGS. 5B illustrates an example of the sample circuit, showing more detail. FIGS. 6 and 7 illustrate an example of the modification of the upstream logic block 320 and domino logic block 310, respectively. These sets of figures are only examples. The process described above may be applied to any similarly constructed circuit.

FIG. 5A is a block diagram of a sample circuit which may be modified according to the present invention. FIG. 5A is a block diagram illustrating an instruction fetch unit (IFU) 500, having a 7:1 multiplexer (MUX) 510, and two 2:1 MUX 530, 535 coupled to a 16 byte Rotator 540 and an instruction decode block 545. The 7:1 MUX 510 connects several inputs to a single output. Select lines control which of the inputs is connected to the output. The 16-byte rotator 540 aligns fetched lines appropriately, such that the instruction decode block always sees the start of a valid instruction as the first byte. Because of performance needs, in one embodiment, the 16-byte rotator 540 is implemented in domino logic. The instruction decode block 545 utilizes the instructions fetched by the instruction fetch unit 500.

The upstream logic block 320 consists of a 7:1 MUX 510 and two instruction buffers, IBx 520 and IBy 525. The domino logic block 310 consists of two 2:1 MUXes 530, 535 which select inputs from the 7:1 MUX 510 or the instruction buffers 520, 525. In this instance, each of the MUXes 530, 535 are indicated as a separate domino logic blocks 310. This is done for convenience, in the later illustrations. The downstream logic block 330 consists of the 16 byte Rotator 540 and the instruction decode unit 545. Please note that in this embodiment the two instruction buffers 520, 525 are merely latches. Thus, they are not illustrated in more detailed illustrations of the present invention.

An IFU 500 is idle when it is waiting for an instruction, or if the instruction decode block 545 is busy and the buffers of the IFU 500 are full. In such a case, because the IFU 500 is idle, the inputs to the 2:1 MUXes 530, 535 do not change. However, as described above, the output of the 2:1 MUXes 530, 535 might nonetheless toggle. The present invention is designed to keep the output of the 2:1 MUXes 530, 535 from toggling in at least some cases.

FIG. 5B is a partial diagram of the circuit of FIG. 5A, showing details of the unmodified upstream logic block 320 a 7:1 MUX 510 and the 2:1 MUX 530 implemented as a domino logic block 310. The upstream logic block 320 is coupled to an input of the domino logic block 310. Note that the instruction buffers 520, 525 illustrated in FIG. 5A may be present, however, they are not illustrated, as they would only obscure the present invention. Returning to FIG. 5B, an output of the 2:1 MUX 530 is coupled to a downstream logic 330.

The multiplexer 510 includes a 7:1 multiplexer (MUX) 510. Seven data lines 552a–552g are input to seven NAND gates 555a–555g, respectively. The other input to each of the NAND gates 555a–555g are seven select lines 550a–550g, respectively. The outputs of NAND gates 555a, 555b, and 555c are inputs to an OR gate 560a with inverted inputs. The outputs of NAND gates 555d, 555e, 555f, and 555g are inputs to a four input OR gate 560b with negated inputs. The outputs of the gates 560a, 560b are input to a NOR gate 565.

The output of the 7:1 MUX 510, or NAND gate 565, is the data line 552a–552g corresponding to the asserted select line 550a–550g. Only one select line 550a–550g is asserted at any one time. If no select lines 550a–550g are asserted, the MUX 510 is idle, and its output is a one. This output of the multiplexer 510 is an input to the domino logic block 530.

The domino 2:1 MUX 530 illustrated, is a 2:1 MUX 530. Thus, the domino logic 310 illustrated in FIG. 5A consists of two 2:1 MUXes 530, 535.

The domino 2:1 MUX 530 may be implemented by four N-type metal oxide semiconductor (NMOS) devices 575, 580, 585, 590. A first NMOS device 575 and second NMOS device 580 are coupled in series. A third NMOS device 585 and a fourth NMOS device 590 are coupled in series, and connected in parallel with the first and second NMOS 575, 580 devices. The input to the first NMOS device 580 is the IN signal 380, or $D_0$. The input to the second NMOS device 575 is a first select, $S_0$ while the input to the fourth NMOS device 585 is a second select, $S_1$. Only one of $S_1$ or $S_0$ will be active at any one time. The input to the fourth NMOS device 590 is $D_1$. Other functions may be similarly implemented.

The domino 2:1 MUX 530 is coupled to a PMOS precharge transistor 340, which pulls the output of the domino MUX 600, OUT 390, high during precharge phase, while CLK# signal 150 is low. The domino 2:1 MUX 530 is also connected to a NMOS evaluation transistor 350. The domino 2:1 MUX 530 is connected to the NMOS evaluation transistor 350, which only allows evaluation while CLK# signal 150 is high. The output of the domino 2:1 MUX 530, OUT signal 595, is an input to a downstream logic block 330.

In this instance, the domino 2:1 MUX 530 implements a function which has an output of zero for an input of one. During default/idle state of the 7:1 MUX 510, all signals go to zero, and the data, $D_0$ and $D_1$, are 1 during the default/idle state. Therefore, the output of the domino logic block 530 toggles in every clock cycle. Therefore, this circuit needs to be modified in order to eliminate this unnecessary toggling when the MUX is idle.

FIG. 6 is a partial diagram of the circuit of FIG. 5B, showing the details of the modified upstream logic 510', modified according to the present invention. The modified multiplexer 510' is coupled to an input of the domino logic block 310. An output of the domino logic block 310 is coupled to a downstream logic 330.

The modified multiplexer 510' is a 7:1 MUX 510, as described above. However, each of data lines 552a–552g are inverted by inverters 610a–610g, respectively. The data lines 552a–552g are inverted before the data is coupled to the NAND gates 555a–555g. Thus, seven data lines 552a–552g are coupled through seven inverters 610a–610g, and the output of the inverters 610a–610g are coupled to inputs of seven NAND gates 555a–555g, respectively. The other input to each of the NAND gates 555a–555g are the respective one of seven select lines 550a–550g. The outputs of NAND gates 555a, 555b, and 555c are inputs to an NOR gate 560g with negated inputs. The outputs of NAND gates 555d, 555e, 555f, and 555g are inputs to a four input NOR gate 560b with negated inputs. The outputs of the NOR gates 560a, 560b are input to a NAND gate 565. The output of the final NOR gate 565 is coupled to an inverter 630. The output of the inverter is the output of the modified multiplexer 510'.

The output of the 7:1 multiplexer 510, or NOR gate 565, is the data corresponding to the asserted select line 550a–550g. There are two inverters in the logic stream from the data line 552a–552g to the output of the inverter 630. Thus, the two inverters, 610a–610g and 630 cancel each other out, when a data line 552a–552g is selected. However, when no data line is selected the idle output of the modified multiplexer 510' is inverted by inverter 630. Thus, the idle output of the multiplexer 510' is a zero, rather than a one. This zero is input to the domino logic block 310. The domino logic block 310 has an output which is a one, when its input from the multiplexer 510' is a zero. Therefore, the output of the domino logic block 310 does not toggle unnecessarily because of the modifications in the multiplexer 510'. This results in considerable power savings. In one implementation of the above instruction fetch unit approximately 2.5% power savings is achieved compared to a similar unmodified instruction fetch unit. An alternative modification of logic is described with respect to FIG. 7.

FIG. 7 is a partial diagram of the circuit of FIG. 5B, showing the details of the modified domino logic, modified according to the present invention. The modified domino MUX 530' does not change the output of the domino MUX 530', except in the case of a toggling output.

The domino MUX 530' includes four NMOS devices 575, 580, 585, 590. A first N-type metal oxide semiconductor (NMOS) device 575 and second NMOS device 580 are coupled in series. A third NMOS device 585 and a fourth NMOS device 590 are coupled in series, and connected in parallel with the first and second NMOS 575, 580 devices. Each of the inputs to the four NMOS devices 575, 580, 585, 590 are inverted using inverters 710, 720, 730, and 740, respectively. This results in an inverted output for the domino MUX 530', OUT# signal 760.

The domino MUX 530' is coupled to a PMOS precharge transistor 340, which pulls the output of the domino MUX 530', OUT# 760, high during the precharge phase, while CLK# signal 150 is low. The domino MUX 530' is also connected to a NMOS evaluation transistor 350. The domino MUX 530' is connected to the NMOS evaluation transistor 350, which only allows evaluation while CLK# signal 150 is high.

The OUT# signal 760 is inverted using inverter 750. Thus, by inverting the OUT# signal 760, the OUT signal 770 is recovered. Thus, the inversion does not change the output of the domino MUX 530' when the domino MUX 530' is operating. However, it does prevent the domino MUX 530' from toggling when it has a stable high input signal. The OUT signal 770 is coupled to the input of the downstream logic block 330. The domino logic block 530' may be further simplified using known methods of simplifying digital circuits.

Figure 8:
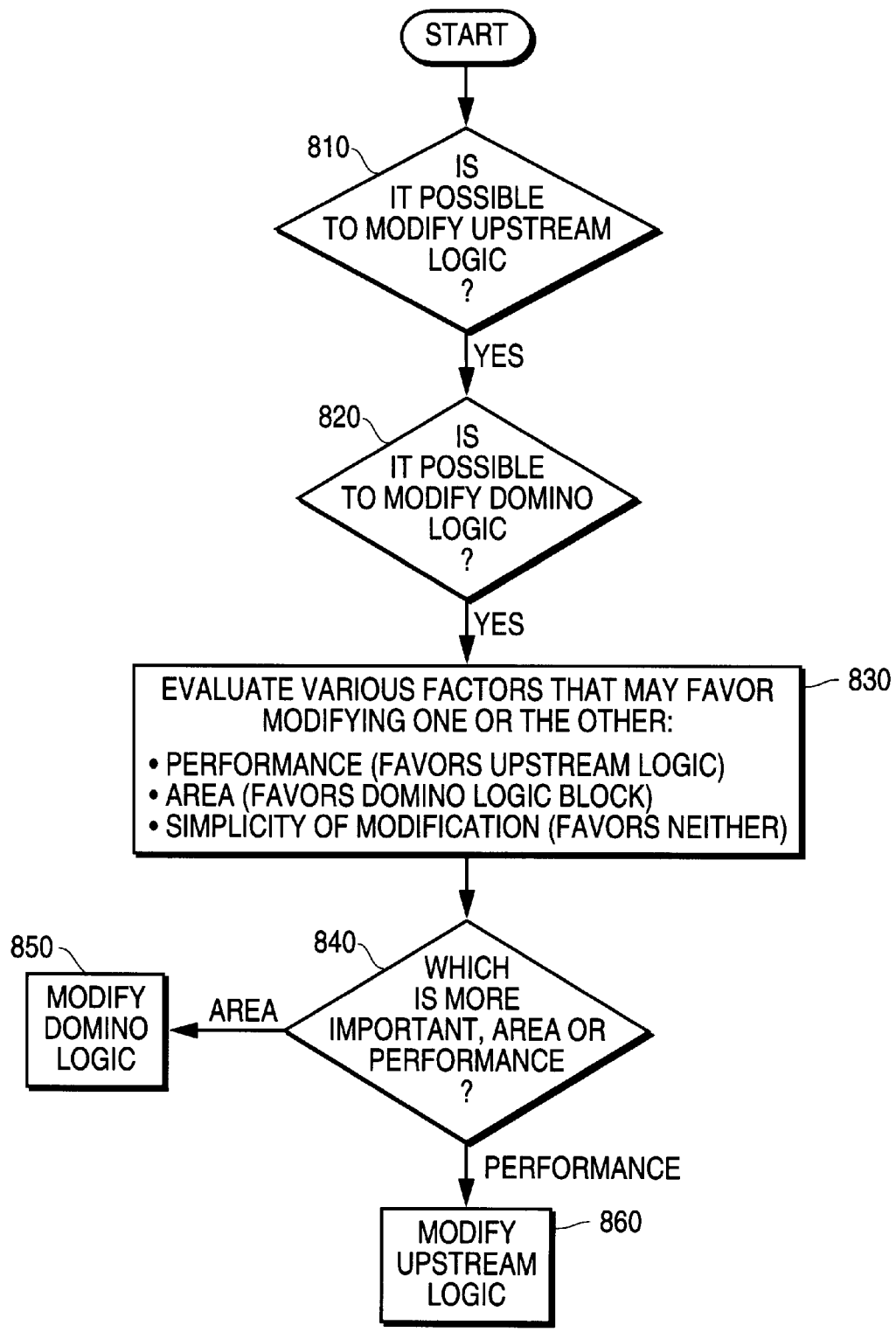
FIG. 8 is a sample flowchart illustrating the process of determining which logic to modify, as shown in FIG. 4C, for the circuit shown in FIG. 5A.

FIG. 8 illustrates a chart of deciding which circuit to modify in the circuits shown in FIG. 5A. FIG. 8 steps through the flowchart shown in FIG. 4C of choosing which circuit to modify, upstream logic 320 or domino logic block 310. FIGS. 6 and 7 illustrate two methods of modifying the same instruction fetch unit. Option I is modifying the upstream logic 320, while Option II is modifying the domino logic block 310.

At block 810, the process tests whether it is possible to modify the upstream logic 320. As shown by FIG. 5C, the upstream logic block 320 can be modified.

At block 820, the process tests whether it is possible to modify the domino logic block 310. As shown by FIG. 7, the domino logic block 310 can be modified.

At block 830, the process evaluates various factors that may favor modifying one or the other logic. In this instance, three specific factors are listed. The factors which are considered may vary depending on the specific circuit. In one embodiment, the factors considered include performance, area, simplicity of modification, cost, etc.

The first factor is performance. In this instance, Option I adds only one inversion in the critical speed path. The critical path is between the select signals sel1–sel7 550a–550g of the 7:1 MUX 510' and the output of the domino logic block 310. In FIG. 5C, there is only one inverter, inverter 630, added in the critical speed path. Using Option II, there are two inverters added in the critical path. In FIG. 7, the critical speed path contains inverter 720 and one of inverters 730 or 740. Thus, the performance factor favors Option I, or modifying the upstream logic.

The second factor is area. In this instance, Option I includes eight additional inverters. There are eight inverters 575a–575g, one for each data or select line, and the final inverter 580. Using Option II, only five inverters 710, 720, 730, 740, and 750 are needed. Thus, the area factor favors Option II, or modifying the domino logic.

The third factor is simplicity of modification. In this instance, the modification for both Options is equally simple. It must be noted that in some instances the specific circuit layout may influence simplicity of implementation. This factor is disregarded in the present example.

Thus, because the factors are evenly divided, at block 840, the process queries which is more important, area or performance. This decision depends entirely on the use planned for the circuit. If the minimization of area is more important, the process continues to block 850, and the domino logic block 310 is modified. If the maximization of speed performance is more important, the process continues to block 860, and the upstream logic 320 is modified. Therefore, if timing is more important, Option I should be selected, and if area is critical, Option II should be selected.

Thus, first, one evaluates each of the factors individually. If all factors favor one type of modification, that modification is implemented. If there are factors favoring both types of modification, the decision is made as to which of those factors is more important. Based on this process, the decision can be made as to the circuit which will be modified.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. The present invention should not be construed as limited by such embodiments and examples, but rather construed according to the following claims.

What is claimed is:

1. A method of saving power in a domino logic block, an input of the domino logic block being an output of an upstream logic block, the method comprising the steps of:
   identifying a first state of the output of the upstream logic block;
   determining an output of the domino logic block for said first state; and
   modifying a logic block, so that the output of the domino logic block for the first state is the same as a precharge state of the output, thereby preventing the output of the domino logic block from toggling when the first state is the input to the domino logic block;
   wherein said step of modifying the upstream logic block comprises the step of complementing the first state output of the upstream logic block.

2. The method of claim 1, wherein said first state is an idle state.

3. The method of claim 1, wherein said first state is a default state.

4. The method of claim 1, wherein said first state is a most frequently occurring state.

5. The method of claim 1, wherein said step of modifying comprises the step of modifying the upstream logic block such that the first state results in the output of the domino logic block being in the precharge state.

6. The method of claim 1, wherein said first state is one of the following states: an idle state, a default state, and a most frequently occurring state.

7. The method of claim 1, wherein said step of complementing the first state output comprises the steps of:
   inverting a plurality of inputs of said upstream logic block; and
   inverting the output of the upstream logic block, prior to coupling it to the input of the domino logic block.

8. The method of claim 1, wherein said step of modifying comprises the step of modifying the upstream logic block such that the first state results in the output of the domino logic block being in the precharge state.

9. A method of saving power in a domino logic block, an input of the domino logic block being an output of an upstream logic block, the method comprising the steps of:

identifying an idle state of the output of the upstream logic block;

determining an output of the domino logic block for said first state; and if the output of the domino logic block is not equal to a precharge state of the output, modifying the upstream logic block, said step of modifying comprising the steps of:

complementing inputs of the upstream logic block; and complementing the output of the upstream logic block.

10. A method of saving power in a domino logic block, an input of the domino logic block being an output of an upstream logic block, the method comprising the steps of:

identifying an idle state of the output of the upstream logic block;

determining an output of the domino logic block for said first state; and if the output of the domino logic block is not equal to a precharge state of the output, modifying the domino logic block, said step of modifying comprising the steps of:

complementing inputs of the domino logic block; and complementing the output of the domino logic block.

11. An apparatus for saving power in a domino logic block comprising:

an upstream logic block having an output, said output having a first state;

the domino logic block having said output of said upstream logic block as an input to said domino logic block;

said upstream logic block being modified such that said first state produces an output of said domino logic block which is identical to a precharge output of said domino logic block;

wherein said modified logic block comprises:

a plurality of inputs of said upstream logic block being inverted; and the output of the upstream logic block being inverted, prior to coupling it to the input of the domino logic block.

12. The apparatus of claim 11, wherein said first state is a most frequently occurring state.

13. The apparatus of claim 11, wherein said first state is an idle state.

14. The apparatus of claim 11, wherein said first state is a default state.

15. A method of saving power in a domino logic block, an input of the domino logic block being an output of an upstream logic block, the method comprising the steps of:

identifying a first state of the output of the upstream logic block;

determining an output of the domino logic block for said first state; and modifying a logic block, so that the output of the domino logic block for the first state is the same as a precharge state of the output, thereby preventing the output of the domino logic block from toggling when the first state is the input to the domino logic block;

wherein said step of modifying logic block comprises the step of changing a polarity of the output of the domino logic block.

16. The method of claim 15, wherein said step of changing a polarity comprises the steps of:

complementing inputs of said domino logic block; and complementing the output of said domino logic block.

17. An apparatus for saving power in a domino logic block comprising:

an upstream logic block having an output, said output having a first state;

the domino logic block having said output of said upstream logic block as an input to said domino logic block;

said domino logic block being modified such that said first state produces an output of said domino logic block which is identical to a precharge output of said domino logic block;

wherein said modified domino logic block comprises:

a plurality of inputs of said domino logic block being inverted; and the output of the domino logic block being inverted.

18. The apparatus of claim 17, wherein said first state is an idle state.

19. The apparatus of claim 17, wherein said first state is a default state.

20. The apparatus of claim 17, wherein said first state is a most frequently occurring state.

* * * * *

UNITED STATES PATENT AND TRADEMARK OFFICE
CERTIFICATE OF CORRECTION

PATENT NO. : 6,005,417
DATED : December 21, 1999
INVENTOR(S) : Mehta et al.

It is certified that error appears in the above-identified patent and that said Letters Patent is hereby corrected as shown below:

In column 1, at line 36, after "CLK#" insert --150--.

In column 5, at line 22, after "If" insert --domino logic block 310--.

In column 7, at line 50, delete "NAND" and insert --NOR--.

In column 7, at line 51, after "is the" insert --inverted--.

In column 8, at line 7, after "during" insert --the--.

In column 8, at line 16, after "all" insert --select--.

In column 8, at line 40, delete "560g" and insert --560a--.

In column 8, at line 43, delete "NAND" and insert --NOR--.

Signed and Sealed this

Twenty-fourth Day of April, 2001

*Attest:*

NICHOLAS P. GODICI

*Attesting Officer*     *Acting Director of the United States Patent and Trademark Office*